United States Patent
Braceras et al.

(10) Patent No.: US 9,548,104 B1
(45) Date of Patent: Jan. 17, 2017

(54) BOOST CONTROL TO IMPROVE SRAM WRITE OPERATION

(71) Applicant: INTERNATIONAL BUSINESS MACHINES CORPORATION, Armonk, NY (US)

(72) Inventors: George M. Braceras, Essex Junction, VT (US); Venkatraghavan Bringivijayaraghavan, Tamilnadu (IN); Krishnan S. Rengarajan, Bangalore (IN); Rahul Nayak, Bhopal (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/755,557

(22) Filed: Jun. 30, 2015

(51) Int. Cl.
- G11C 11/00 (2006.01)
- *G11C 11/419* (2006.01)
- *G11C 8/08* (2006.01)
- G11C 8/10 (2006.01)

(52) U.S. Cl.
CPC ............ *G11C 11/419* (2013.01); *G11C 8/08* (2013.01); *G11C 8/10* (2013.01)

(58) Field of Classification Search
CPC ........ G11C 8/08; G11C 11/413; G11C 11/412; G11C 8/10; G11C 8/14; G11C 8/12
USPC .......... 365/154, 230.08, 189.09, 189.05
See application file for complete search history.

(56) References Cited

U.S. PATENT DOCUMENTS

| | | | |
|---|---|---|---|
| 7,643,357 B2 | 1/2010 | Braceras et al. | |
| 7,983,071 B2 * | 7/2011 | Houston | H01L 27/0207 365/154 |
| 8,120,975 B2 | 2/2012 | Kenkare et al. | |
| 8,228,713 B2 | 7/2012 | Arsovski et al. | |
| 8,233,337 B2 | 7/2012 | Arsovski et al. | |
| 8,233,342 B2 | 7/2012 | Adams et al. | |
| 8,355,276 B2 | 1/2013 | Idgunji et al. | |
| 8,363,453 B2 | 1/2013 | Arsovski et al. | |
| 8,369,180 B2 * | 2/2013 | Yu | G11C 8/08 365/189.09 |
| 8,427,896 B1 | 4/2013 | Agarwal et al. | |
| 8,441,874 B2 | 5/2013 | Sinha et al. | |
| 8,493,810 B2 * | 7/2013 | van Winkelhoff | G11C 7/02 365/189.04 |
| 8,493,812 B2 | 7/2013 | Dengler et al. | |
| 8,503,247 B2 | 8/2013 | Yoshioka | |
| 8,582,351 B2 | 11/2013 | Arsovski et al. | |
| 8,593,890 B2 | 11/2013 | Adams et al. | |
| 8,619,463 B2 | 12/2013 | Cheng et al. | |

(Continued)

OTHER PUBLICATIONS

Liu et al., "Low-power High-yield SRAM Design with VSS Adaptive Boosting and BL Capacitance Variation Sensing", IEEE International Conference, 2013, 4 pages.

(Continued)

*Primary Examiner* — David Lam
(74) *Attorney, Agent, or Firm* — Steven Meyers; Andrew M. Calderon; Roberts Mlotkowski Safran Cole & Calderon, P.C.

(57) ABSTRACT

Approaches for providing write-assist boost for a Static Random Access Memory (SRAM) array are provided. A circuit includes a write driver of a Static Random Access Memory (SRAM) array. The circuit also includes a boost circuit that dynamically varies a write-assist boost voltage based on a stability assist setting applied to a wordline of the array.

20 Claims, 7 Drawing Sheets

(56) References Cited

U.S. PATENT DOCUMENTS

| 8,773,918 B2 | 7/2014 | Tanabe |
| 9,208,900 B2 * | 12/2015 | Sinangil ................ G11C 29/52 |
| 2013/0064007 A1 | 3/2013 | Deng |
| 2013/0064031 A1 | 3/2013 | Phan et al. |
| 2013/0155793 A1 | 6/2013 | Schreiber et al. |
| 2014/0112062 A1 | 4/2014 | Trivedi et al. |
| 2014/0160871 A1 | 6/2014 | Zimmer et al. |
| 2014/0204657 A1 | 7/2014 | Dally |

OTHER PUBLICATIONS

Kulkarni et al., "Capacitive-coupling Wordline Boosting with Self-induced VCC Collapse for write VMIN reduction in 22-nm 8T SRAM", IEEE International Conference, 2012, pp. 234-236.

Chang et al., "A 20nm 112Mb SRAM in High-κ Metal-gate with Assist Circuitry for Low-leakage and Low-VMIN Applications", IEEE International Conference, 2013, 3 pages.

Moradi et al., "Multi-level Wordline Driver for Low Power SRAMs in Nano-scale CMOS Technology", IEEE International Conference, 2011, pp. 326-331.

* cited by examiner

BOOST CONTROL TO IMPROVE SRAM WRITE OPERATION

FIELD OF THE INVENTION

The invention relates to semiconductor devices and, more particularly, to static random access memory (SRAM) devices and methods of manufacturing the same.

BACKGROUND

Static random access memory (SRAM) is a type of semiconductor memory used in many integrated circuit applications, from embedded memory (e.g., as cache memory and register files) in general purpose processors and application specific integrated circuits to external memories. SRAM is a desirable type of memory due to its high-speed, low power consumption, and simple operation. Unlike dynamic random access memory (DRAM), SRAM does not need to be regularly refreshed to retain the stored data, and its design is generally straightforward.

A typical SRAM cell includes a pair of cross-coupled inverters that hold a desired data bit value (i.e., either a 1 or a 0) and the complement of that value. While SRAM is a desirable type of memory, it is known that if not properly designed and fabricated, an SRAM cell can become unstable when accessed, at which point the held bit value is upset, i.e., switches. Moreover, the stability of an SRAM cell is in full conflict with the writeability of the cell with respect to the strengths of the N-type devices (transistors) and P-type devices (transistors) within the cell. Readability of an SRAM cell is the ability drive a required signal magnitude onto the bitline within a specified time allocated for signal development, and is a function of the read current of the cell. There tends to be a performance conflict between stability and readability/writeability in such cells. Techniques that increase stability typically have the adverse effect of decreasing readability/writeability. Conversely, techniques that increase readability/writeability typically have the adverse effect of decreasing stability.

SRAM stability is a measure of how much "noise" the cell can tolerate before it loses its data. Stability disturb is a condition that can occur during both read and write operations of an SRAM cell. A particular technique to improve stability is lowering the world line potential during a write operation; however, such lowering of the word line potential negatively affects the writeability.

SUMMARY

In a first aspect of the invention, there is a circuit including a write driver of a Static Random Access Memory (SRAM) array. The circuit also includes a boost circuit that dynamically varies a write-assist boost voltage based on a stability assist setting applied to a wordline of the array.

In another aspect of the invention, there is a circuit including a wordline driver that is configured to apply one of a plurality of stability assist settings to a writeline during a write operation to a selected cell of a Static Random Access Memory (SRAM) array. The circuit also includes a write driver comprising a boost circuit that is configured to apply one of a plurality of boost voltages to a bitline of the selected cell during the write operation, wherein the one of the plurality of boost voltages is based on the one of the plurality of stability assist settings.

In another aspect of the invention, there is a method of providing write-assist boost for a Static Random Access Memory (SRAM) array. The method includes varying a write-assist boost voltage of a bitline connected to a selected cell of the array based on a stability assist setting applied to a wordline connected to the selected cell during a write operation to the selected cell.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and, more particularly, to static random access memory (SRAM) devices and methods of manufacturing the same. According to aspects of the invention, a write-assist boost voltage is dynamically varied based on a stability assist setting applied in lowering the potential of the wordline during a write operation of a selected SRAM cell. In embodiments, a different level of boost is associated with each respective stability assist setting. Dynamically varying the boost based on the stability assist setting increases the writeability of the selected cell without affecting the stability of the half-selected cells. In this manner, implementations of the invention improve writeability when stability assist is turned on, but do not pose reliability concerns on the pass gate. The improved writeability can be translated into either higher performance or higher density. Aspects described herein may also be used to improve readability of multi-port memories.

Figure 1:
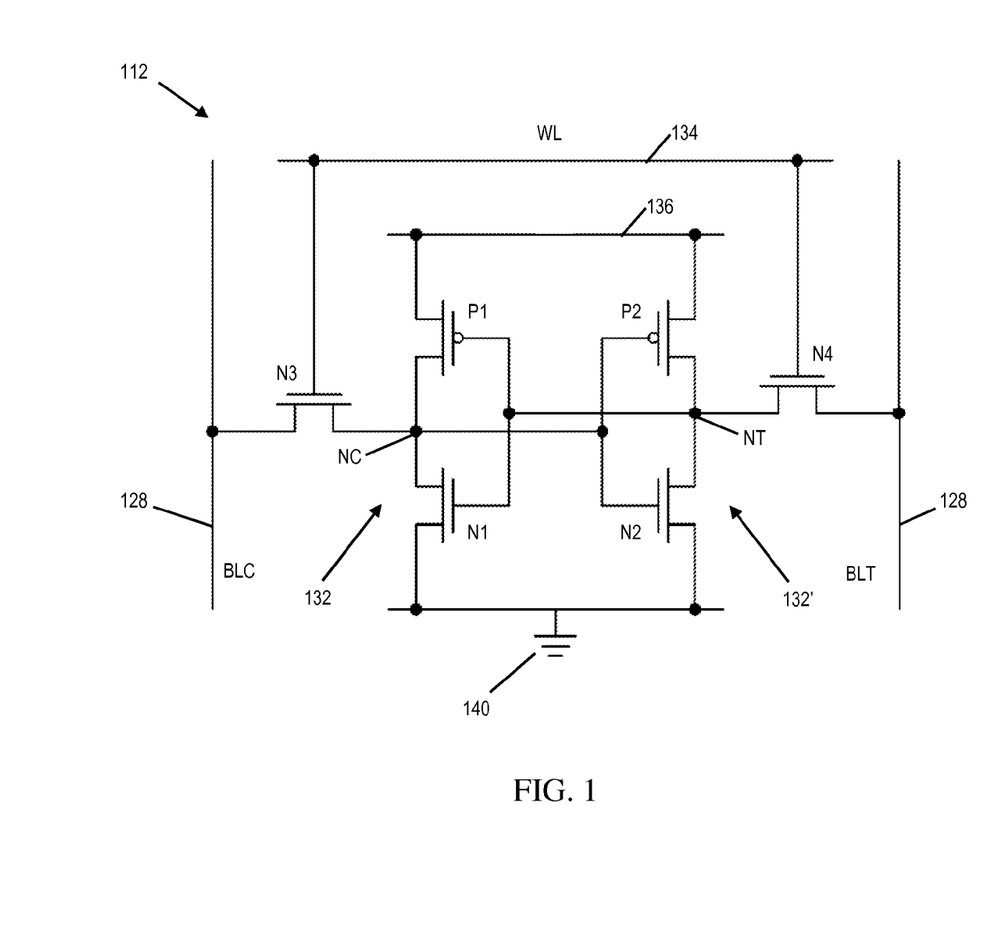
FIG. 1 depicts an SRAM cell.

FIG. 1 depicts an exemplary 6T SRAM cell 112 that may be included in an array. Cell 112 includes a pair of cross-coupled inverters 132, 132' each formed by one of a pair p-type load (or pull-up) transistors P1, P2 electrically connected to a voltage source line 136 and a corresponding one of a pair of n-type drive (or pull-down) transistors N1, N2 electrically connected to a voltage sink line 140, e.g., ground. Together, cross-coupled inverters 132, 132' form a latch circuit that is capable of storing a single data bit. Cell 112 has two stable states used to denote a "1" bit and a "0" bit, respectively, on internal "storage" nodes NC, NT. Two additional n-type transistors N3, N4, called "access" or "pass-gate" transistors, electrically connect cross-coupled inverters 132, 132' to corresponding respective ones of bit lines BLC, BLT (128) and are controlled by a corresponding wordline WL (134).

In operation, the bit lines BLT, BLC are typically pre-charged to a high voltage (at or near power supply voltage), and are equalized to the same voltage at the beginning of both read and write cycles, after which the bit lines BLT, BLC then float at that precharged voltage. To access cell 112 for a read operation, the word line WL is then energized, turning on pass transistors N3, N4, and connecting storage nodes NT, NC to the then-floating precharged bit lines BLT, BLC. The differential voltage developed on bit lines BLT, BLC is then sensed and amplified by a sense amplifier. In a write operation, typical modern SRAM memories include write circuitry that pulls one of then-floating precharged bit lines BLT or BLC low (i.e., to a voltage at or near ground voltage), depending on the data state to be written. Upon word line WL then being energized, the low level bit line BLT (or BLC) will pull down its associated storage node NT (or NC), causing the cross-coupled inverters of addressed cell 112 to latch in the desired state.

Device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node NC, if bit line BLC is unable to sufficiently discharge storage node NC to trip the inverter 132' composed of transistors P2 and N2, cell 112 may not latch to the desired data state. Cell stability failures are the converse of write failures meaning that a write failure occurs when a cell fails to change its state when the change is intended, while a cell stability failure occurs when a cell changes its state when the change is not intended.

Figure 2:
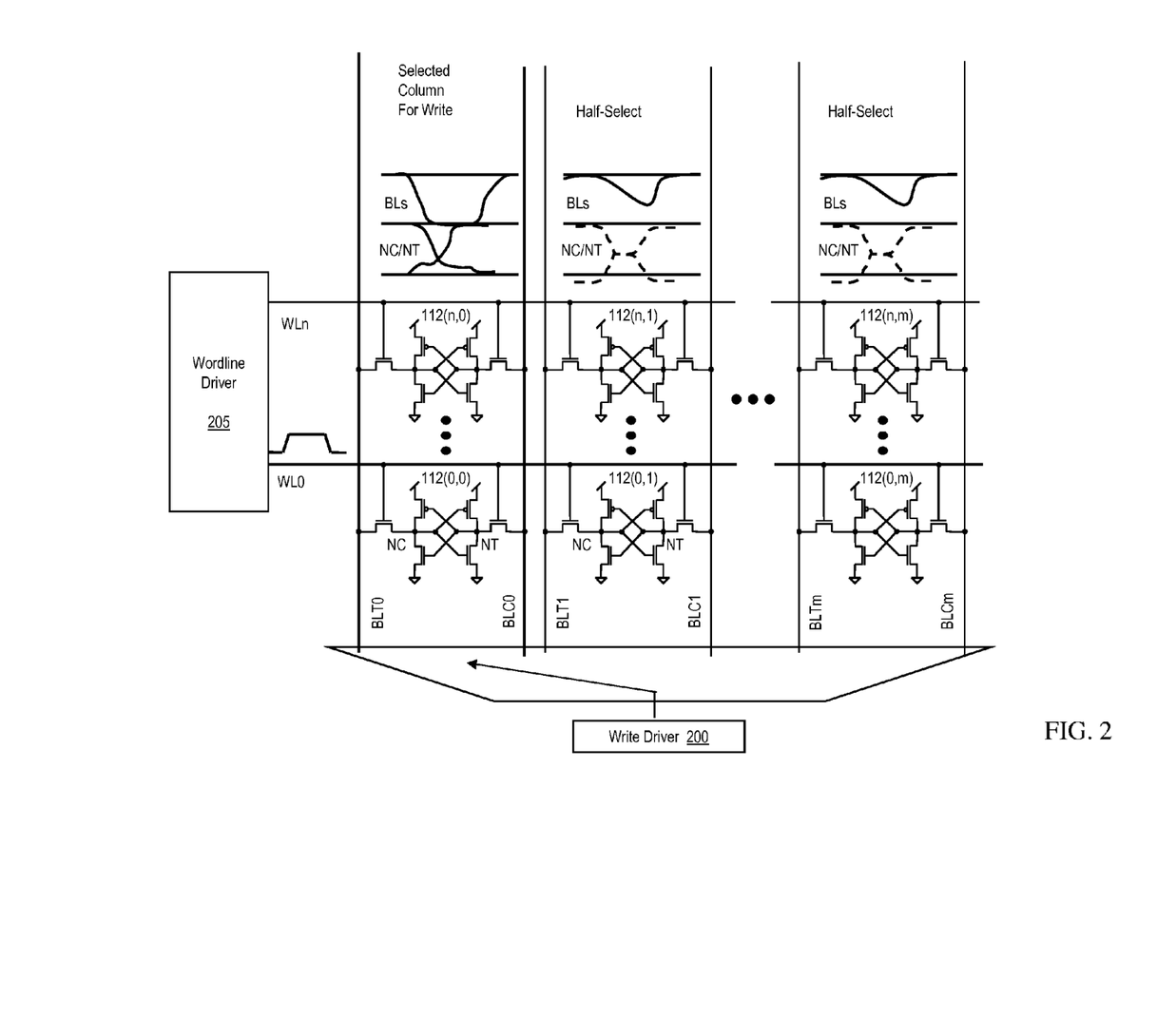
FIG. 2 depicts an SRAM array.

FIG. 2 shows an exemplary array 190 of SRAM cells (each of which may be similar to cell 112) and an associated write driver 200 and wordline driver 205. The cells of the array 190 are arranged in "n" rows and "m" columns where "n" and "m" may be any desired integers. Each cell in a particular row is operatively connected to a common wordline for that row. For example, cells 112(0,0), 112(0,1), . . . , 112(0,m) are connected to wordline WL0. Each cell in a particular column is operatively connected to a pair of common bitlines for that column. For example, cells 112(0, 0), . . . , 112(n,0) are connected to bitlines BLC0 and BLT0. To perform a write operation on a selected cell, e.g., cell 112(0,0), the wordline driver 205 drives the voltage on the cell's wordline (e.g., WL0) to a high level, and the write driver 200 drives the voltage on one of the bitlines of the cell's column (e.g., BLT0 or BLC0) to a low level from a precharged high level. The row containing the particular cell is referred to as the selected row, and the column containing the particular cell is referred to as the accessed column. The other cells in the selected row are referred to as half-selected since their wordline is energized while their respective bitlines remain floating. The half-selected cells are particularly vulnerable to the stability disturb condition during the write operation to the selected cell. The stability disturb can upset the stored data state of the half-selected cells, for example causing a false write of data to one or more of the half-selected cells.

Figures 3A, 3B:
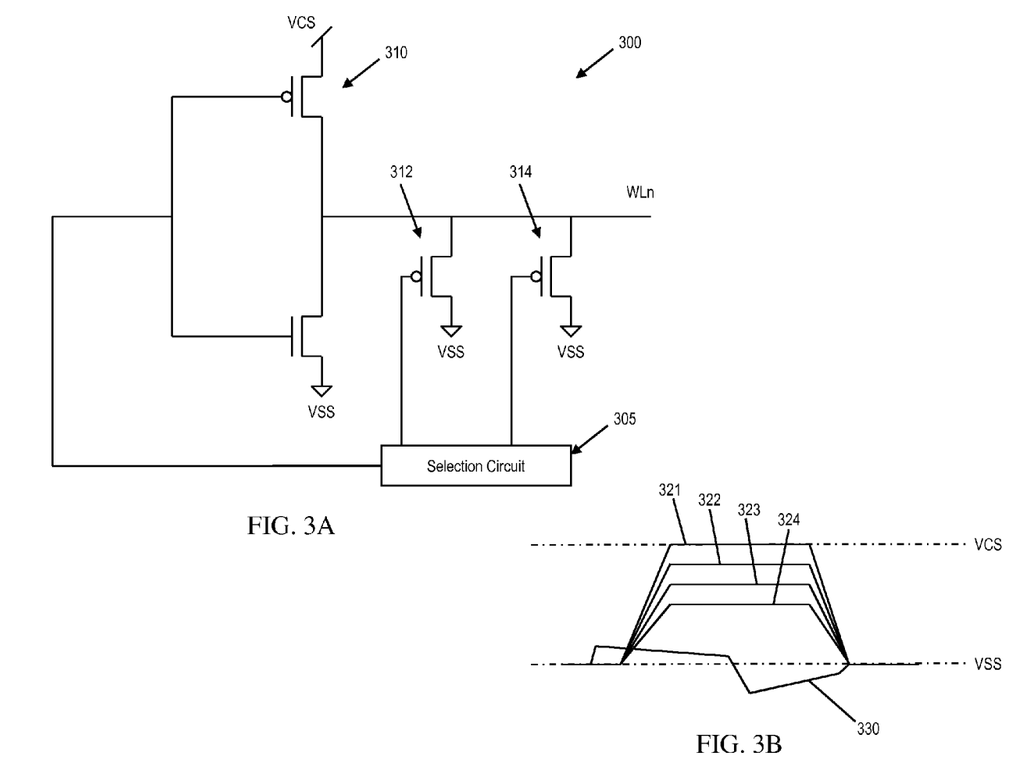
FIGS. 3A and 3B show a stability assist circuit and scheme.

FIGS. 3A and 3B illustrate a stability assist circuit 300 and scheme. FIG. 3A shows a portion of a wordline WLn of an SRAM array, such as array 190 of FIG. 2. To perform a write operation on a selected cell in the row connected to the wordline WLn, a selection circuit 305 turns on a pull up device (e.g., transistor) 310 that pulls the voltage of the wordline up to the high voltage supply level, e.g., VCS. To improve the stability of the half selected cells connected to the wordline WLn during the write operation to the selected cell, the voltage of the wordline WLn may be decreased slightly from the full VCS level. To achieve different levels of reduction of the voltage of the wordline WLn, two pull down devices 312 and 314 are connected between the wordline WLn and the low voltage supply level, e.g., VSS. The two pull down devices 312 and 314 have different strengths relative to one another and are selectively turned ON/OFF by the selection circuit 305 to apply different levels of stability assist (i.e., different stability assist settings). The stability assist circuit 300 including the selection circuit 300 may be included in a wordline driver circuit, such as wordline driver 205 of FIG. 2.

FIG. 3B illustrates the voltage on the wordline WLn during a write operation as a result of different ON/OFF states of the pull down devices 312 and 314. When both devices 312 and 314 are OFF (referred to as the <0,0> stability assist setting), the voltage on the wordline WLn equals VCS as depicted by line 321. When the first device 312 is OFF and the second device 314 is ON (referred to as the <0,1> stability assist setting), the voltage on the wordline WLn equals VCS reduced by a first amount as depicted by line 322. When the first device 312 is ON and the second device 314 is OFF (referred to as the <1,0> stability assist setting), the voltage on the wordline WLn equals VCS reduced by a second amount as depicted by line 323. When the first device 312 is ON and the second device 314 is ON (referred to as the <1,1> stability assist setting), the voltage on the wordline WLn equals VCS reduced by a third amount as depicted by line 324.

The stability assist technique depicted in FIGS. 3A and 3B, i.e., slightly reducing the wordline voltage below the full VCS level during the write operation, improves the stability of half-selected cells but decreases the write-ability of the selected cell. This decrease in the writeability may be alleviated by applying a write-assist boost to the low level (i.e., pulled down) bitline of the accessed column. The write-assist boost (referred to herein simply as boost) drives the potential of the low level bitline below the low voltage supply level VSS of the storage cell. In this manner, for a given wordline voltage, applying boost increases the difference between the wordline voltage and the low level bitline voltage of the selected cell (compared to the case where no boost is used). The difference between the wordline voltage and the low level bitline voltage of the selected cell represents the Vgs of the passgate of the selected cell and, thus, directly affects the writeability of the cell. As such, applying boost provides better writeability for the selected cell at a particular level of wordline voltage compared to the case where no boost is used with the same wordline voltage.

FIG. 3B shows an exemplary boost voltage 330 relative to the different wordline voltages 321, 322, 323, 324 during a write operation to a selected cell. As illustrated in FIG. 3B, the boost voltage 300 is driven lower than the VSS level of the cell. As further illustrated in FIG. 3B, the boost voltage 300 is the same for each setting of stability assist, e.g., for each of the different wordline voltages 321, 322, 323, 324.

According to aspects of the invention, the boost voltage is dynamically varied based on the stability assist setting applied in lowering the potential of the wordline during a write operation of a selected SRAM cell. In embodiments, a different level of boost is associated with each respective setting of stability assist. In a particular embodiment, the different levels of boost and the different levels of stability assist are configured such that the difference between the wordline voltage and the low level bitline voltage of the selected cell is substantially the same for all levels of stability assist.

Figure 4A:
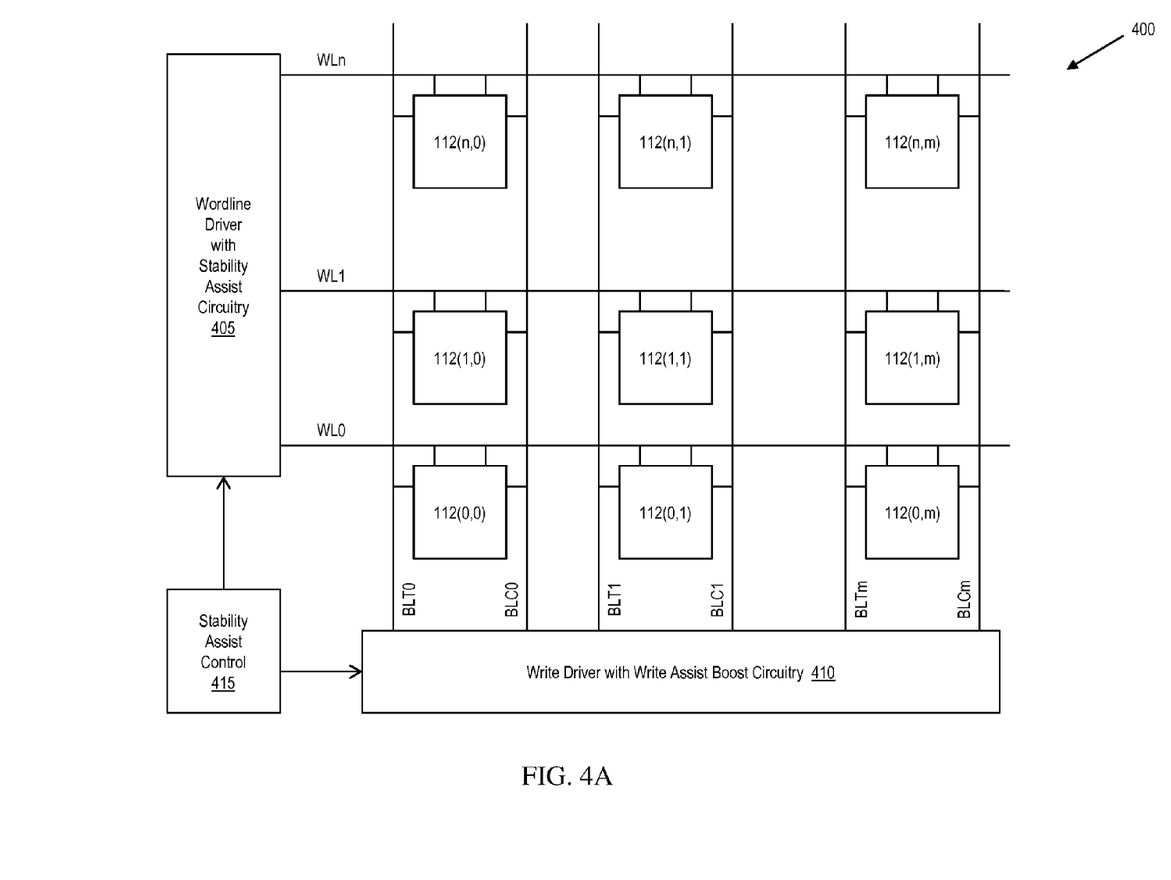
FIGS. 4A and 4B show an array with stability assist and dynamic boost in accordance with aspects of the invention.
Figure 4B:
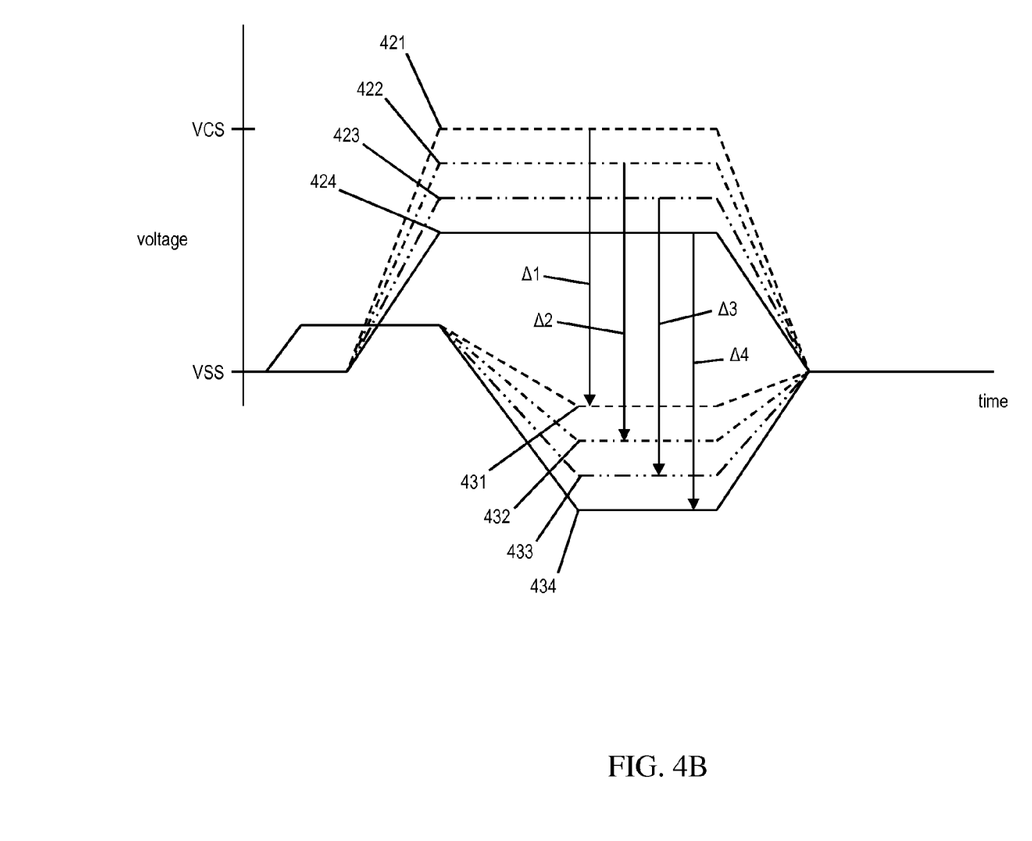

FIGS. 4A and 4B illustrate boost that is dynamically varied with stability assist in accordance with aspects of the invention. FIG. 4A shows a portion of an SRAM array 400 including a number of cells 112(n,m) arranged in "n" rows and "m" columns where "n" and "m" are any desired integers. Each cell 112(n,m) may be similar to cell 112 shown in FIG. 1. A wordline driver 405 is connected to each wordline (WL0, WL1, . . . , WLn) of the array 400 and includes circuitry for controlling the voltage on each wordline. The wordline driver 405 includes stability assist circuitry, e.g., similar to element 300 shown in FIG. 3A, that is configured to apply one of a plurality of stability assist settings (i.e., discrete levels of voltage reduction) to the wordline voltage during a write operation to a selected cell in the selected row.

Still referring to FIG. 4A, a write driver circuit 410 is connected to the two bitlines of each column (e.g., BLT0, BLC0, BLT1, BLC1, BLTm, BLCm) and includes circuitry for controlling the voltage on each bitline. In embodiments, the write driver circuit 410 includes write assist boost circuitry that is configured to apply one of plural discrete levels of boost to a particular bitline during the write operation to the selected cell in the accessed column.

With continued reference to FIG. 4A, a stability assist control 415 is connected to the wordline driver 405 and the write driver 410. In embodiments, the stability assist control 415 includes circuitry that controls the level of boost applied by the write driver 410 based on the stability assist setting (i.e., the level of voltage reduction) that is applied to the wordline voltage during a write operation to a selected cell in the selected row. The stability assist control 415 may be separate from the wordline driver 405 and the write driver 410, may be completely contained in one of the wordline driver 405 and the write driver 410, or may be partially contained in one or both of the wordline driver 405 and the write driver 410.

FIG. 4B shows a plot of wordline voltage of a selected wordline and the boost voltage applied to a selected bitline during a write operation to a selected cell of the array 400 (of FIG. 4A) in accordance with aspects of the invention. Line 421 represents the wordline voltage for a first setting of stability assist, e.g., the <0,0> stability assist setting as described with respect to FIGS. 3A and 3B. Line 422 represents the wordline voltage for a second setting of stability assist, e.g., the <0,1> stability assist setting as described with respect to FIGS. 3A and 3B. Line 423 represents the wordline voltage for a third setting of stability assist, e.g., the <1,0> stability assist setting as described with respect to FIGS. 3A and 3B. Line 424 represents the wordline voltage for a fourth setting of stability assist, e.g., the <1,1> stability assist setting as described with respect to FIGS. 3A and 3B.

Still referring to FIG. 4B, line 431 represents the boost voltage (referred to as WBOOST in FIGS. 5 and 6) for a first level of boost that is applied when the first stability assist setting (e.g., setting <0,0>) is employed. Line 432 represents the boost voltage (WBOOST) for a second level of boost that is applied when the second stability assist setting (e.g., setting <0,1>) is employed. Line 433 represents the boost voltage (WBOOST) for a third level of boost that is applied when the third stability assist setting (e.g., setting <1,0>) is employed. Line 434 represents the boost voltage (WBOOST) for a fourth level of boost that is applied when the fourth stability assist setting (e.g., setting <1,1>) is employed. As depicted in FIG. 4B, the level of boost that is applied to the selected bitline varies based on the stability assist setting that is applied to the selected wordline. In this manner, by providing for different levels of boost, the difference between the wordline voltage and the bitline voltage can be configured to remain substantially constant for each of the stability assist settings.

For example, the wordline driver 405 including the stability assist circuitry may be structured and arranged such that the wordline voltage for the second stability assist setting (e.g., setting <0,1> corresponding to line 422) is about 48 mV lower than the wordline voltage for the first stability assist setting (e.g., setting <0,0> corresponding to line 421). In embodiments, the write driver 410 including the write assist boost circuitry are structured and arranged such that the boost voltage for the second level of boost (e.g., line 432) is about 48 mV lower than the boost voltage for the first level of stability assist (e.g., line 431). In this manner, the delta (difference) between lines 421 and line 431 (e.g., Δ1) is substantially the same as the delta between lines 422 and line 432 (e.g., Δ2). In a similar manner, Δ3 and Δ4 may be substantially the same as Δ1. Aspects of the invention are not limited to 48 mV, and any suitable value may be employed. Moreover, the invention is not limited to four discrete levels of wordline voltage (e.g., lines 421-424) and four discrete levels of boost voltage (e.g., lines 431-434), and instead any desired number of levels may be employed. Further, the invention is not limited to all deltas being substantially the same, and instead different deltas may be configured.

Dynamically varying the boost voltage (WBOOST) based on the stability assist setting applied to the wordline voltage, as described with respect to FIGS. 4A and 4B, increases the writeability of the selected cell without affecting the stability of the half-selected cells. Simulations show that dynamically varying the boost voltage as described herein increases writeability by 0.7σ to 1.0σ when the stability assist is used, which amounts to a vast improvement in yield.

Figure 5:
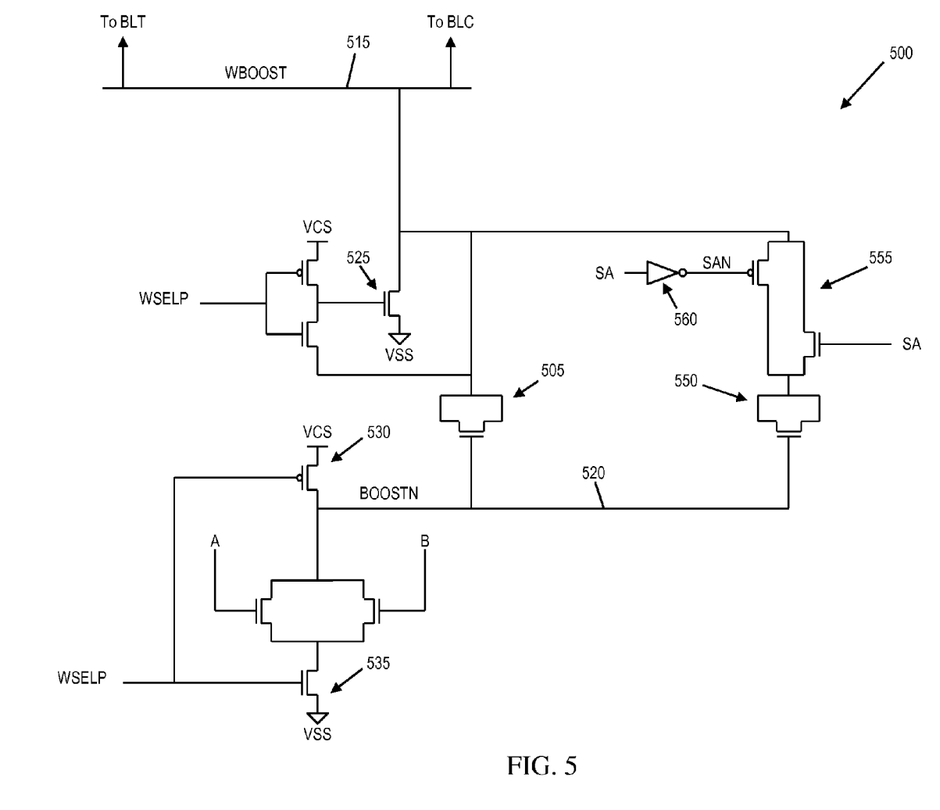
FIG. 5 shows a first embodiment of a boost circuit in accordance with aspects of the invention.

FIG. 5 shows a first embodiment of a boost circuit 500 in accordance with aspects of the invention. The circuit 500 may be included in the write driver 410 of FIG. 4A, for example. In embodiments, the circuit 500 includes a first capacitor 505 that applies a level of boost to a bitline of a selected cell during a write operation at a first stability assist setting (e.g., the <0,0> setting). The capacitor is connected between a line 515 having a WBOOST voltage and a line 520 having a BOOSTN voltage. Line 515 is connected by switches to the bitlines of the cells in a particular column of the array (e.g., in a manner similar to that shown in FIG. 6) and WBOOST is the boost voltage that drives the potential of one of the bitlines lower than VSS.

Still referring to FIG. 5, during a write operation to a cell in the accessed column, the WSELP signal initially causes the transistor 525 to be ON which holds (pre-charges) WBOOST at VSS. At the same time that WBOOST is held at VSS, the WSELP signal causes the transistor 530 to be ON which charges BOOSTN to VCS. To apply boost to the bitline of the selected cell (i.e., to drive the voltage of the bitline below VSS), the WSELP signal is switched to a different logic state (e.g., from low to high) which turns OFF the transistor 525, which causes WBOOST to float. Switching the WSELP signal also turns OFF the transistor 530 and turns on the transistor 535, which pulls BOOSTN from VCS to VSS. The action of BOOSTN going from VCS to VSS causes the capacitor 505 to drive WBOOST lower than VSS, which applies the first level of boost to the one of the bitlines.

With continued reference to FIG. 5, the circuit 500 includes a second capacitor 550 that applies an additional level of boost to the bitline of the selected cell during a write operation at a second stability assist setting (e.g., the <0,1> setting). In embodiments, a transmission gate 555 is connected in series with the second capacitor 550 between the WBOOST and BOOSTN lines. The transmission gate 555 is turned ON/OFF using a signal SA that is set at a first logic state (e.g., low) when the stability assist is not applied, and that is set at a second logic state (e.g., high) when the stability assist is applied. In this manner, the transmission gate 555 turns OFF when stability assist is not applied, which causes the second capacitor 550 to have no effect on WBOOST. Conversely, when stability assist is applied to the wordline, the transmission gate 555 turns ON which causes the second capacitor to drive down WBOOST when BOOSTN goes from VCS to VSS. As such, when stability assist is applied to the wordline, both the first capacitor 505 and the second capacitor 550 drive down WBOOST when BOOSTN goes from VCS to VSS, which drives WBOOST further below VSS compared to when only the first capacitor 505 is driving WBOOST down.

As thus described with respect to FIG. 5, only the first capacitor 505 drives down WBOOST when zero stability assist is applied to the wordline (e.g., a first stability assist setting). This corresponds to lines 421 and 431 of FIG. 4B. On the other hand, when stability assist is applied to the wordline (e.g., a second stability assist setting), both the first capacitor 505 and the second capacitor 550 drive down WBOOST to a lower level. This corresponds to lines 422 and 432 of FIG. 4B. In this manner, the level of boost is dynamically varied based on the stability assist setting associated with the wordline.

Still referring to FIG. 5, WSELP is a control signal provided by the write driver 410. The line 515 having the WBOOST voltage may be connected to respective write driver data lines that are coupled to the cell bitlines by write driver switches, e.g., in a manner similar to that shown in FIG. 6. SA is a control signal provided by the stability assist control 415. The complement signal SAN is created from the SA signal using an inverter 560. Nodes A and B of FIG. 5 may be respectively connected in a manner similar to that of nodes A' and B' of FIG. 6.

Figure 6:
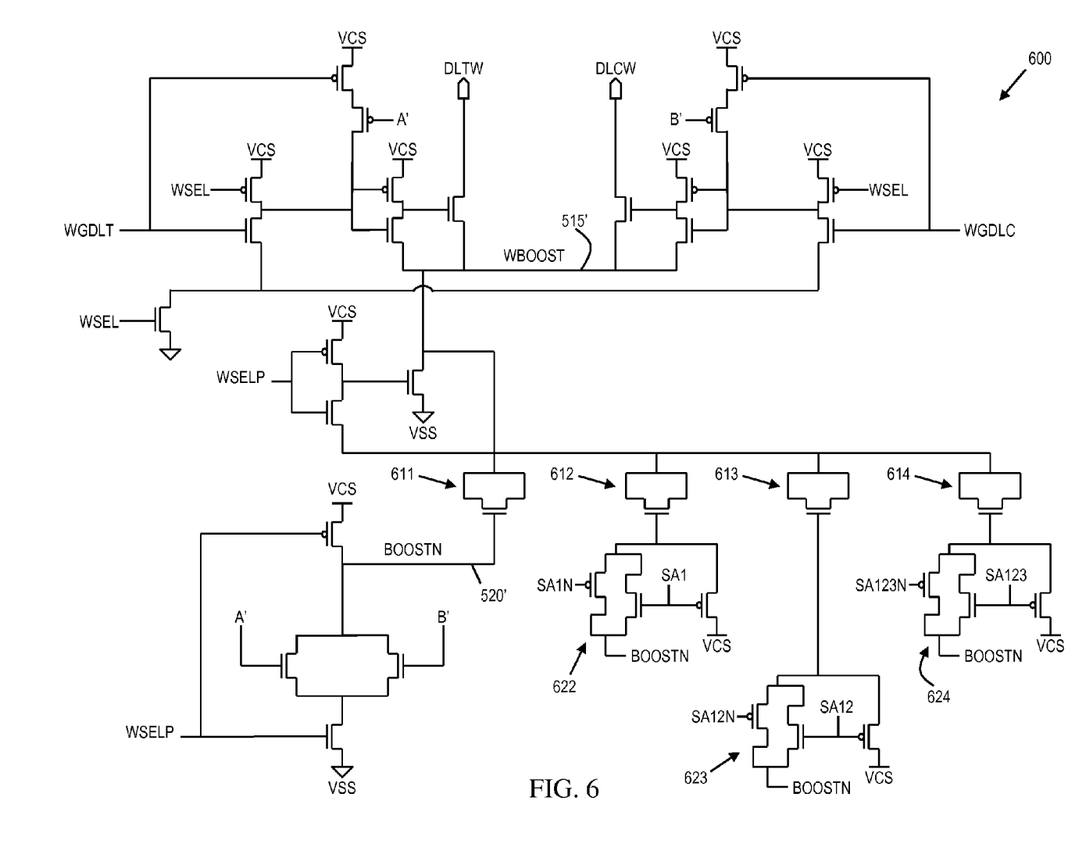
FIG. 6 shows a second embodiment of a boost circuit in accordance with aspects of the invention.

FIG. 6 shows a second embodiment of a boost circuit 600 in accordance with aspects of the invention. The boost circuit 600 may be included in the write driver 410 of FIG. 4A, for example. In embodiments, the boost circuit 600 is structured and arranged such that: one capacitor provides a first level of boost when a first stability assist setting is applied to the wordline; two capacitors provide a second level of boost when a second stability assist setting is applied to the wordline; three capacitors provide a third level of boost when a third stability assist setting is applied to the wordline; and four capacitors provide a fourth level of boost when a fourth stability assist setting is applied to the wordline.

The boost circuit 600 is configured to drive the WBOOST voltage below VSS when the BOOSTN voltage is taken from VCS to VSS, e.g., in a manner similar to that described with respect to FIG. 5. In embodiments, the boost circuit 600 comprises four capacitors 611, 612, 613, 614 connected in parallel between line 515' having the WBOOST voltage and line 520' having the BOOSTN voltage. Each capacitor 612, 613, 614 is connected in series with a respective transmission gate 622, 623, 624. In embodiments, the boost circuit selectively controls respective transmission gates associated with the second capacitor, third capacitor, and fourth capacitor based on the stability assist setting applied to the wordline. Specifically, the boost circuit applies signals SA1, SA12, and SA123 to the respective transmission gates 622, 623, 624 to selectively turn ON/OFF certain ones of the transmission gates 622, 623, 624 to selectively cause certain ones of the capacitors 612, 613, 614 to drive the WBOOST voltage. For example, in a first state the stability assist control 415 provides a signal to the wordline driver circuit 410 to apply the <0,0> stability assist setting to the wordline voltage as represented by line 421 of FIG. 4B. In the first state, the stability assist control 415 provides signals SA1, SA12, and SA123 at levels that turn OFF the transmission gates 622, 623, 624. In this state, only the first capacitor 611 provides a first level of boost to the WBOOST voltage when BOOSTN is transitioned from VCS to VSS during the write, which corresponds to the boost voltage represented by line 431 in FIG. 4B.

In a second state the stability assist control 415 provides a signal to the wordline driver circuit 410 to apply the <0,1> stability assist setting to the wordline voltage as represented by line 422 of FIG. 4B. In the second state, the stability assist control 415 provides signal SA1 at a level that turns ON transmission gate 612 and signals SA12 and SA123 at levels that turn OFF the transmission gates 623 and 624. In this state, capacitors 611 and 612 provide a second level of boost to the WBOOST voltage when BOOSTN is transitioned from VCS to VSS during the write, which corresponds to the boost voltage represented by line 432 in FIG. 4B.

In a third state the stability assist control 415 provides a signal to the wordline driver circuit 410 to apply the <1,0> stability assist setting to the wordline voltage as represented by line 423 of FIG. 4B. In the third state, the stability assist control 415 provides signals SA1 and SA12 at levels that turn ON the transmission gates 622 and 623 and signal SA123 at a level that turns OFF the transmission gate 624. In this state, capacitors 611, 612, and 613 provide a third level of boost to the WBOOST voltage when BOOSTN is transitioned from VCS to VSS during the write, which corresponds to the boost voltage represented by line 433 in FIG. 4B.

In a fourth state the stability assist control 415 provides a signal to the wordline driver circuit 410 to apply the <1,1> stability assist setting to the wordline voltage as represented by line 424 of FIG. 4B. In the fourth state, the stability assist control 415 provides signals SA1, SA12, and SA123 at levels that turn ON the transmission gate 622, 623, 624. In this state, the capacitors 611, 612, 613, and 614 provide a fourth level of boost to the WBOOST voltage when BOOSTN is transitioned from VCS to VSS during the write, which corresponds to the boost voltage represented by line 433 in FIG. 4B.

Still referring to FIG. 6, WSEL, WSELP, WGDLT, and WGDLC are control signals provided by the write driver 410. The line 515' having the WBOOST voltage is connected to respective write driver data lines DLTW and DLCW, which are coupled to the cell bitlines by write driver switches. SA1, SA12, and SA123 are control signals provided by the stability assist control 415. The complement signals SA1N, SA12N, and SA123N are created using respective inverters in a similar manner as shown with SA and SAN in FIG. 5. Nodes A' are connected to one another and nodes B' are connected to one another, although the connections are not shown in FIG. 6.

The boost circuit 600 described with respect to FIG. 6 provides extra boost capacitance in order to generate higher boost. The boost circuit 600 is configured to switch ON and OFF this extra boost capacitance based on the stability assist setting. Control signals corresponding to the stability assist settings are used to selectively turn ON/OFF the extra boost capacitance.

The structures (e.g., circuits) of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit, comprising:
    a write driver of a Static Random Access Memory (SRAM) array; and
    a boost circuit that dynamically varies a write-assist boost voltage based on a stability assist setting applied to a wordline of the array.

2. The circuit of claim 1, wherein the stability assist setting applied to the wordline is one of a plurality of stability assist settings defined by a stability assist circuit included in a wordline driver of the array;
    the plurality of stability assist settings comprises a first stability assist setting that reduces a voltage on the wordline of a selected cell by a first amount below a full high voltage supply level during a write operation;
    the plurality of stability assist settings comprises a second stability assist setting that reduces the voltage on the wordline of the selected cell by a second amount below the full high voltage supply level during the write operation;
    the first amount is different than the second amount.

3. The circuit of claim 2, wherein a different level of the write-assist boost voltage is associated with each respective one of the plurality of stability assist settings.

4. The circuit of claim 1, wherein the boost circuit comprises a first capacitor and a second capacitor connected in parallel between a first line and a second line, wherein the write-assist boost voltage is on the first line.

5. The circuit of claim 4, wherein the boost circuit is configured such that:
    only the first capacitor drives the write-assist boost voltage when a first stability assist setting is applied to the wordline; and
    both the first capacitor and the second capacitor drive the write-assist boost voltage when a second stability assist setting is applied to the wordline.

6. The circuit of claim 4, wherein the boost circuit comprises a transmission gate connected in series with the second capacitor between the first line and the second line.

7. The circuit of claim 6, wherein:
    a control signal turns off the transmission gate when a first stability assist setting is applied to the wordline; and
    the control signal turns on the transmission gate when a second stability assist setting is applied to the wordline.

8. The circuit of claim 1, wherein the boost circuit comprises a first capacitor, a second capacitor, a third capacitor, and a fourth capacitor connected in parallel between a first line and a second line, wherein the write-assist boost voltage is on the first line.

9. The circuit of claim 8, wherein the boost circuit selectively controls respective transmission gates associated with the second capacitor, third capacitor, and fourth capacitor based on the stability assist setting applied to the wordline.

10. The circuit of claim 1, wherein the boost circuit is included in the write driver.

11. A circuit, comprising:
    a wordline driver that is configured to apply one of a plurality of stability assist settings to a wordline during a write operation to a selected cell of a Static Random Access Memory (SRAM) array; and
    a write driver comprising a boost circuit that is configured to apply one of a plurality of boost voltages to a bitline of the selected cell during the write operation, wherein the one of the plurality of boost voltages is based on the one of the plurality of stability assist settings.

12. The circuit of claim 11, wherein:
    the plurality of stability assist settings comprises at least a first stability assist setting and a second stability assist setting;
    the first stability assist setting reduces a voltage on the wordline of the selected cell by a first amount below a full high voltage supply level during the write operation;
    the second stability assist setting reduces the voltage on the wordline of the selected cell by a second amount below the full high voltage supply level during the write operation;
    the first amount is different than the second amount; and
    the plurality of boost voltages comprises at least a first boost voltage and a second boost voltage.

13. The circuit of claim 12, wherein:
    the boost circuit generates the first boost voltage when the first stability assist setting is applied to the wordline; and
    the boost circuit generates the second boost voltage when the second stability assist setting is applied to the wordline.

14. The circuit of claim 12, wherein the boost circuit comprises:
a first capacitor;
a second capacitor; and
a transmission gate connected to the second capacitor.

15. The circuit of claim 14, wherein the boost circuit:
turns off the transmission gate when the first stability assist setting is applied to the wordline; and
turns on the transmission gate when the second stability assist setting is applied to the wordline.

16. A method of providing write-assist boost for a Static Random Access Memory (SRAM) array comprising:
varying a write-assist boost voltage of a bitline connected to a selected cell of the array based on a stability assist setting applied to a wordline connected to the selected cell during a write operation to the selected cell.

17. The method of claim 16, wherein:
the stability assist setting applied to the wordline is one of a plurality of stability assist settings defined by a stability assist circuit included in a wordline driver of the array; and
the varying comprises generating a different level of the write-assist boost voltage for each respective one of the plurality of stability assist settings.

18. The method of claim 16, wherein the varying comprises selectively controlling a transmission gate connected to a capacitor based on the stability assist setting applied to the wordline.

19. The method of claim 16, wherein the varying comprises selectively controlling plural transmission gates respectively connected to plural capacitors based on the stability assist setting applied to the wordline.

20. The method of claim 16, wherein:
the stability assist setting increases stability of half-selected cells connected to the wordline by reducing a voltage on the wordline to a value less than a full high voltage supply level during the write operation; and
the write-assist boost voltage increases the writeability of the selected cell by driving a voltage of a low level bitline of the selected cell lower than a low voltage supply level during the write operation.

* * * * *